(12) United States Patent
Younsi et al.

(10) Patent No.: US 9,075,115 B2
(45) Date of Patent: Jul. 7, 2015

(54) SYSTEMS AND METHODS FOR MONITORING THE HEALTH OF AN ELECTRICAL SYSTEM

(75) Inventors: Karim Younsi, Ballston Lake, NY (US); Ruben Jeevanasan Fair, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 776 days.

(21) Appl. No.: 13/222,975

(22) Filed: Aug. 31, 2011

(65) Prior Publication Data

US 2013/0054160 A1 Feb. 28, 2013

(51) Int. Cl.
*G01R 31/00* (2006.01)
*G01R 31/34* (2006.01)

(52) U.S. Cl.
CPC .................................. *G01R 31/343* (2013.01)

(58) Field of Classification Search
CPC ............. G01R 31/343; G01R 31/2801; G01R 31/025; F16H 3/16
See application file for complete search history.

(56) References Cited

U.S. PATENT DOCUMENTS

| 4,156,846 A | 5/1979 | Harrold et al. |
| 4,333,095 A | 6/1982 | Silva |
| 4,342,960 A | 8/1982 | Sawada |
| 4,390,870 A | 6/1983 | Michael |
| 4,394,648 A | 7/1983 | Mattson |
| 4,446,426 A | 5/1984 | Emery et al. |
| 4,451,786 A | 5/1984 | Sawada et al. |
| 4,528,556 A | 7/1985 | Maddox |
| 4,535,377 A * | 8/1985 | Lane .................................. 361/1 |
| 4,636,778 A | 1/1987 | Corkran et al. |
| 4,771,355 A | 9/1988 | Emery et al. |
| 4,940,933 A | 7/1990 | Jenkins |
| 5,087,909 A | 2/1992 | Twerdochlib |
| 5,126,677 A | 6/1992 | Campbell et al. |

(Continued)

FOREIGN PATENT DOCUMENTS

| EP | 0606283 B1 | 7/1994 |
| JP | 57049870 A | 3/1982 |

(Continued)

OTHER PUBLICATIONS

Allgood, G., et al., "A model-based high-frequency matched filter arcing diagnostic system based on principal component analysis (PCA) clustering", Applications and science of computational intelligence III: Orlando, FL, 11 pages. (Apr. 24-27, 2000).

(Continued)

*Primary Examiner* — Elias Desta
(74) *Attorney, Agent, or Firm* — Ann M. Agosti (57) ABSTRACT

The subject matter herein generally relates to electrical generators and motors, and more specifically, to electrical turbogenerators. In an embodiment, an electrical system includes a circuit. The circuit includes one or more rotating power delivery assemblies comprising a plurality of sliding surfaces that deliver power to a rotating load. The circuit also includes one or more radio frequency current transformers (RFCTs) that measure radio frequency (RF) signals corresponding to arcing events in the one or more rotating power delivery assemblies. The electrical system also includes a processor that receives the measurements from the one or more RFCTs and determines a health value of the circuit based, at least in part, on the received measurements.

14 Claims, 5 Drawing Sheets

(56) References Cited

U.S. PATENT DOCUMENTS

| | | |
|---|---|---|
| 5,416,430 A | 5/1995 | Twerdochlib et al. |
| 7,923,892 B2 | 4/2011 | Mark et al. |
| 2005/0184751 A1 | 8/2005 | Hobelsberger et al. |
| 2008/0291040 A1 | 11/2008 | Cutsforth |
| 2008/0291273 A1 | 11/2008 | Cutsforth et al. |
| 2009/0119035 A1 | 5/2009 | Younsi et al. |
| 2009/0267444 A1 | 10/2009 | Mark et al. |
| 2012/0086452 A1* | 4/2012 | Dohata et al. ........... 324/318 |

FOREIGN PATENT DOCUMENTS

| | | |
|---|---|---|
| JP | 1160315 A | 6/1989 |
| JP | 2007166895 A | 6/2007 |
| WO | 2010000350 A1 | 1/2010 |

OTHER PUBLICATIONS

Cheng, J., et al., "Detection of Arcing in DC Motors", Proceedings of Information Decision and Control 99, pp. 563-568 (1999).

Maughan, C., "Maintaining carbon-brush collectors", Generators, Combined Cycle Journal, pp. 98-104 (First Quarter 2010).

Search Report and Written Opinion from corresponding EP Application No. 12182657.2-1560 dated Apr. 29, 2013.

* cited by examiner

SYSTEMS AND METHODS FOR MONITORING THE HEALTH OF AN ELECTRICAL SYSTEM

BACKGROUND

The subject matter disclosed herein relates generally to electrical generators and motors, and more specifically, to electrical turbo-generators.

In general, electricity may be generated by inducing a current on a set of armature windings as a result of the relative motion of a nearby magnetic field. In order to produce this field, some electrical generators may inject a large amount of current (e.g., 1-5 kA) into the field windings of a spinning rotor during operation. Such electrical generators may use collector assemblies, also known as rotating slip ring assemblies, positioned about the rotor and electrically coupling the rotor to a stationary exciter via a number of stationary brushes. Accordingly, these brushes provide conductive paths between the stationary exciter and the spinning rotor such that power may be transmitted to the rotor and the rotating field may be produced. However, during operation, if one or more brushes lose contact with the collector ring, arcing events may occur. For example, a brush and collector ring may arc due to physical wear on the brush and/or ring, excessive vibration of the shaft, the presence of contaminants (e.g., particulates or oil) between the brush and ring, or incorrect brush alignment or installation.

Due to the large voltages and currents operating within many generators, arcing events may cause substantial damage to the collector ring and brushes over time, eventually resulting in a flashover event. During a flashover event, a short circuit path may form within the rotor between the positive and negative terminals of the exciter, between the positive terminal of the exciter and ground, and/or between the negative terminal of the exciter and ground. Generally speaking, a flashover event results in a catastrophic failure of the generator, leaving the generator inoperable. Furthermore, a flashover event may cause substantial damage to other electrical components coupled to the generator as well as personnel or equipment that may be physically located near the generator. In general, regularly scheduled inspection and maintenance of a generator is often required in order to verify the integrity of the brush/slip ring assembly and minimize the risk of flashover.

However, regularly scheduled inspection and maintenance of a generator is costly. In general, much of the inspection and maintenance of a generator may actually be performed while the generator continues to operate, increasing the complexity and safety risks of such maintenance. Furthermore, reliance on such a maintenance schedule only takes the operational time of the equipment into consideration, and fails to prioritize maintenance based on device performance or other indicators. That is, for strictly schedule-based maintenance, a healthy generator may receive largely unneeded maintenance based upon the maintenance schedule, while an unhealthy machine requiring servicing may be delayed in receiving maintenance simply because it was recently serviced.

BRIEF DESCRIPTION

In an embodiment, an electrical system includes a circuit. The circuit includes one or more rotating power delivery assemblies comprising a plurality of sliding surfaces that deliver power to a rotating load. The circuit also includes one or more radio frequency current transformers (RFCTs) that measure radio frequency (RF) signals corresponding to arcing events in the one or more rotating power delivery assemblies. The electrical system also includes a processor that receives the measurements from the one or more RFCTs and determines a health value of the circuit based, at least in part, on the received measurements.

In another embodiment, a method includes measuring a first radio frequency (RF) signal power in a circuit of an electrical device using one or more radio frequency current transformers (RFCTs) disposed within the circuit. The method also includes measuring a second RF signal power in the circuit using the one or more RFCTs. The method also includes comparing one or more features of the first and second RF signal power measurements and recommending actions to be performed on the electrical device based, at least in part, on the comparison.

In another embodiment, an electrical generator includes an exciter circuit. The exciter circuit includes a set of rotating field windings and a direct current (DC) exciter that provides power to the exciter circuit. The exciter circuit also includes a collector assembly that delivers power to the set of rotating field windings and comprises a plurality of brushes and collector rings. The exciter circuit also includes a shaft voltage suppressor (SVS) comprising a plurality of radio frequency current transformers (RFCTs) that measure radio frequency (RF) signals corresponding to arcing events in the exciter circuit. The electrical generator includes a processor that receives the measurements from the plurality of RFCTs, processes the measurements to determine power of the RF signals as a function of signal frequency, and assesses the health of the circuit based, at least in part, on the determined on the determined power of the RF signals.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

The disclosed embodiments enable the detection of arcing events in electrical systems that involve the transfer of power to a rotating body. For example, the disclosed embodiments enable the detection of arcing events between the brushes and the collector ring (e.g., the sliding surfaces) of a collector assembly in a generator. Since arcing events typically increase in frequency as certain electrical systems begin to malfunction (e.g., due to accumulated wear on the brushes and collector rings), the disclosed embodiments enable the monitoring of the health of the collector assembly based upon the detected arcing events. As such, the disclosed embodiments enable health-based maintenance, rather than strictly schedule-based maintenance, of electrical equipment, which may afford both cost and safety benefits.

Additionally, the disclosed embodiments enable the assessment of the health of a live collector without having to take the equipment offline, redirect power away from portions of the equipment, or otherwise disrupt the electrical system, which minimizes maintenance cost and equipment downtime. Furthermore, the disclosed embodiments enable tuning of the operational parameters (e.g., the power output) of the electrical system based upon the detection of arcing events. That is, the disclosed embodiments enable the tuning of the parameters of a generator or motor to provide an acceptable level of performance that does not cause a substantial degree of arcing to occur. It should also be noted that the disclosed embodiments are generally applicable to any electrical system involving the delivery of power to a rotating body (e.g., via a collector or commutator assembly), including many types of AC generators and DC motors. Indeed, even in certain electrical systems lacking collector or commutator assemblies, the disclosed embodiments may be beneficial for detecting deleterious arcing events within certain elements of the system (e.g., circuit breakers, switches, relays) such that predictions regarding the future performance of the system may be made.

Figure 1:
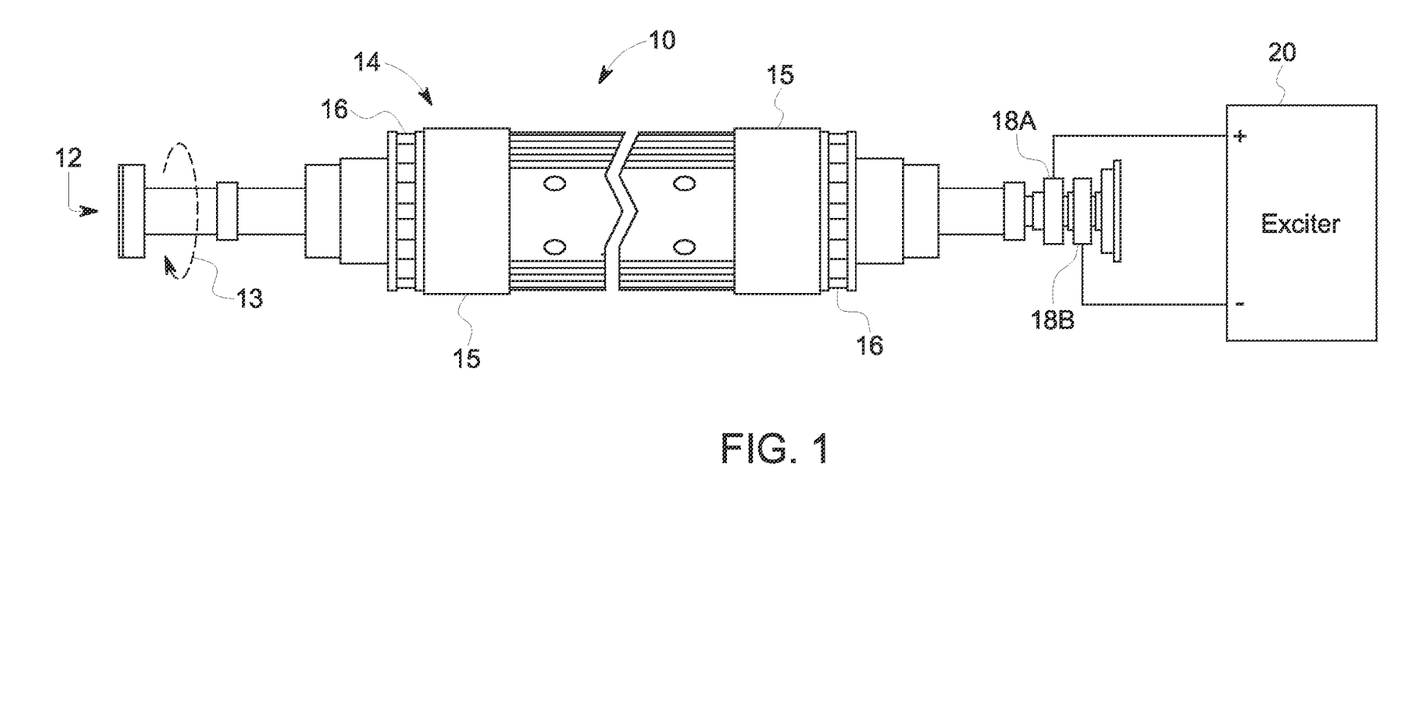
FIG. 1 illustrates an embodiment of the rotor of a typical electrical generator, in accordance with aspects of the present disclosure.

With the foregoing in mind, FIG. 1 illustrates an embodiment of a rotor 10 of an AC electrical generator. The illustrated rotor 10 utilizes a rotating field produced by a spinning electromagnet to induce a current in a set of stationary windings (i.e., the stator, not shown) and, thereby, provide electricity. Accordingly, the rotor 10 may include a shaft 12 disposed though the length of the rotor 10 that may be driven by any mechanical power source. For example, the shaft 12 may be rotated 13 by an engine (e.g., a combustion engine) or a turbine (e.g., a gas-powered, wind-powered, or water-powered turbine) at approximately 3600 revolutions per minute (RPM) for a two pole gas turbine driven turbogenerator. Disposed within a portion of the shaft 12 may be a number of field windings that provide the rotating field when powered. Additionally, a housing 14 may be disposed around the shaft that includes one or more retaining rings 15 to provide support for the rotor windings as well as a number of fans 16 to provide cooling to the rotor 10 during operation.

In the illustrated embodiment, a pair of collector assemblies, 18A and 18B, are also disposed about the shaft 12 and coupled to an exciter 20. More specifically, the collector assembly 18A is coupled to the positive terminal of the exciter 20 and the collector assembly 18B is coupled to the negative terminal of the exciter 20. The exciter 20 may be any DC power source, such as a DC generator, battery, or rectifier, capable of supplying DC power to the field windings (e.g., disposed within or about a portion of the shaft 12) in order to produce the rotating field. Generally speaking, the collector assemblies 18 provide a conductive path between the exciter 20 and the field windings within the rotating shaft 12. That is, the collectors 18 electrically couple the stationary exciter 20 and the field windings in the rotating shaft 12 such that the field windings may be energized to produce the rotating field.

Figure 2:
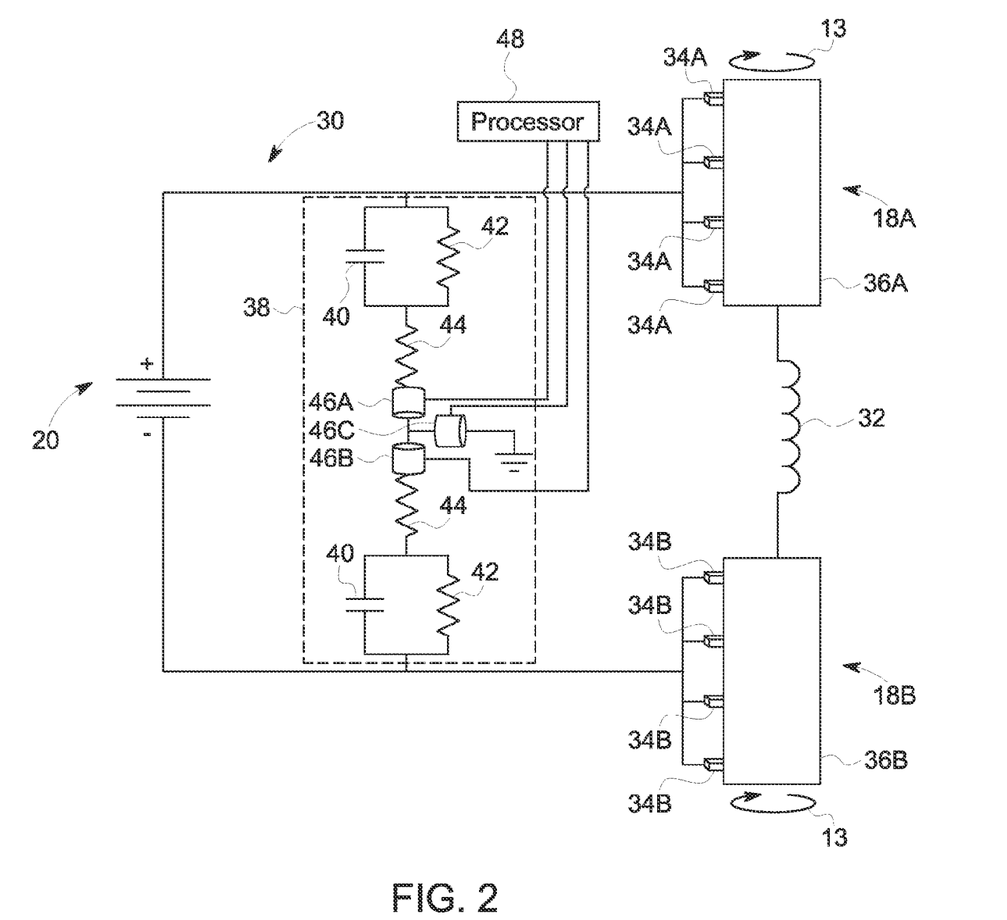
FIG. 2 illustrates an embodiment of an exciter circuit of an electrical generator, in accordance with aspects of the present disclosure.

FIG. 2 illustrates a schematic of an embodiment of a circuit 30 configured to supply power to a set of field windings 32 and configured to detect arcing events in the collector assemblies 18 or anywhere else on the rotor 10. The illustrated circuit 30 includes an exciter 20, collector assemblies 18A and 18B, and field windings 32. Each collector assembly 18 provides a conductive path via a number of conductive, stationary brushes 34 contacting a conductive, rotating collector ring 36 disposed about the shaft 12. These brushes 34 may be manufactured from a number of durable, conductive materials such as a metal, an alloy, or certain types of carbon. The brushes 34 may generally be stationary relative to the rotating collector ring 36. In general, the brushes 34 may remain in contact with the rotating collector ring 36 via an applied force (e.g., a spring force). As the shaft 12 is rotated 13, the free ends of the brushes 34 are designed to remain in physical and electrical contact with the rotating collector ring 36 disposed about the shaft 12. The collector ring 36 may typically be a conductive, metallic ring that is coaxial with the shaft 12, having a smooth (e.g., machined) or grooved surface for contacting the brushes 34.

In the illustrated circuit 30, the brushes 34A of collector assembly 18A are coupled to the positive terminal of the exciter 20, and the brushes 34B of collector assembly 18B are coupled to the negative terminal of the exciter 20. Similarly, the collector ring 36A of collector assembly 18A is coupled to one end of the field windings 32, while the collector ring 36B of collector assembly 18B is coupled to the opposite end of the field windings 32. That is, the rotating collector rings 36 of the collector assemblies 18 are electrically coupled to the field windings such that a complete conductive path may be formed from the exciter 20, through the brushes 34A and collector ring 36A of collector 18A, through the field windings 32, through the brushes 34B and a collector ring 36B of collector 18B, and back to the exciter 20. Accordingly, the collector assemblies 18A and 18B cooperate with the exciter 20 to provide power to the spinning field windings 32 in order to produce the rotating field.

It should be noted that while the collector rings 36 are coupled to the field windings 32, the collector rings 36 and the field windings 32 are both electrically isolated from the remainder of the shaft 12. However, the shaft 12 may have voltages induced by the field windings 32. Accordingly, the illustrated circuit 30 also includes an embodiment of a shaft voltage suppressor (SVS) 38. In general, the SVS 38 may help to alleviate voltages capacitively coupled to the shaft 12 from the energized field windings 32. The illustrated SVS 38 includes two high-value capacitors 40 (e.g., 10 μF), two high-value resistors 42 (e.g., 440 kΩ), and two other resistors 44 (e.g., 1.2Ω). While a particular SVS 38 is illustrated in FIG. 2 for the purpose of illustration, it should be noted SVS designs are numerous and any appropriately rated SVS may be utilized in circuit 30. In certain embodiments, the SVS 38 may be implemented as part of the exciter 20, and in some embodiments the SVS 38 may not be present.

In order to detect RF signals in the circuit 30, the circuit 30 may be equipped with one or more radio frequency (RF) current transformers (RFCTs) 46. For example, the illustrated circuit 30 includes the three RFCTs (e.g., 46A, 46B, and 46C) that may measure the power of RF signals in the circuit 30. Generally speaking, RF signals in the circuit may be the result of arcing events at the interface between the brushes 34 and the collector rings 36 of the collector assemblies 18. That is, imperfect contact between the brushes 34 and the collector rings 36 of the collector assemblies 18 may disrupt the conductive path linking the exciter 20 to the field windings 32. Due to the high current traversing the brushes 34 of the collector assemblies 18 during operation, a disruption in the conductive path may result in a high energy arcing event between the brushes 34 and the collector rings 36. Such an arcing event results in the generation of an RF signal, which may be detected via the one or more RFCTs 46 within the circuit 30.

In certain embodiments, the SVS 38 of the circuit 30 may be modified to include one or more RFCTs 46. For example, the three RFCTs 46A, 46B, and 46C of illustrated circuit 30 are disposed within the SVS 38. However, in other embodiments, one or more RFCTs may be located at any number of different positions within the circuit 30, including positions outside of the SVS 38. In addition to having different positions within the circuit, each RFCT (e.g., 46A, 46B, or 46C) may be configured to measure the RF signal at different frequencies, with different levels of sensitivity, and/or with different dynamic ranges. For example, strategically positioning RFCTs 46 at different portions within the circuit 30 may enable the isolation and subtraction of background RF noise from the RF signal measurements. In general, the output from the RFCTs 46 may be transmitted to a processor 48 (e.g., a scope, a process controller, or a computer) for display and/or further processing.

Figure 3:
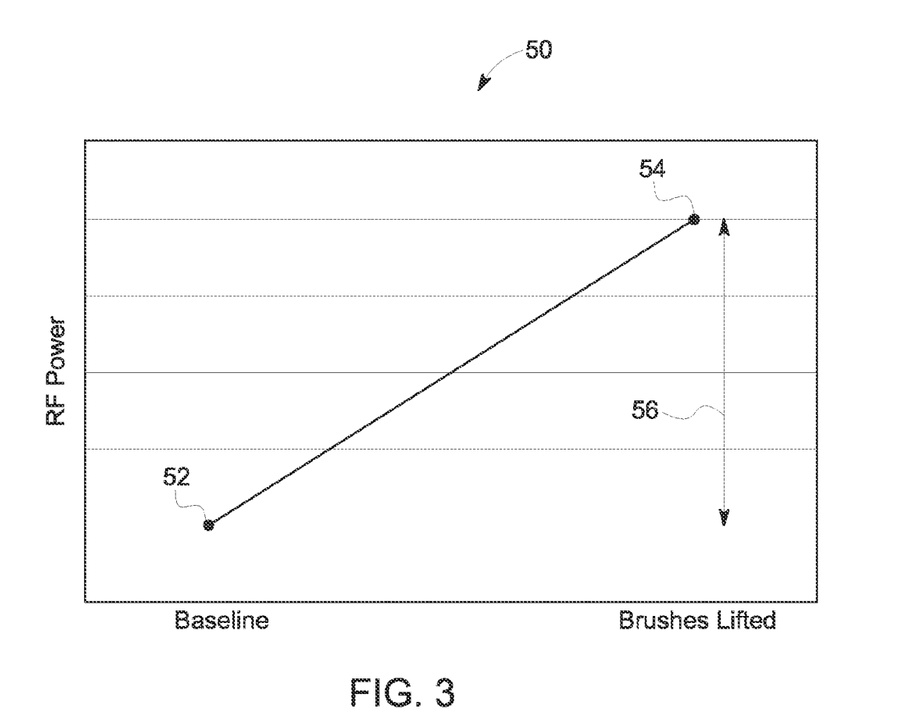
FIG. 3 is a graph illustrating the relative RF signal power in the exciter circuit when one or more brushes lose contact with the collector ring and arcing occurs, in accordance with aspects of the present disclosure.

FIG. 3 depicts a graph 50 that illustrates the general trend for RF signal power as the brushes 34 lose contact with the collector rings 36. In FIG. 3, two points, 52 and 54, are illustrated for different levels of contact between the brushes 34 and the collector rings 36. The first point 52 reflects the baseline RF signal power when the brushes 34 are in good contact with the collector rings 36 and there is no arcing or only low levels of sparking. That is, the first point 52 indicates that a certain amount of RF signal (i.e., baseline signal) is expected within the circuit 30 (e.g., RF noise) even when the brushes 34 and the collector rings 36 are in good contact (e.g., as a result of normal sparking). Generally speaking, while sparking and arcing may represent a similar underlying phenomenon (e.g., a voltage across an air gap), sparking events are substantially lower in energy and are typical in the normal operation of the rotor 10. The second point 54 on the graph 50 illustrates increased RF signal power measured as a result of arcing events within the circuit 30 due to one or more brushes 34 losing contact with the collector rings 36. It should be noted that the higher RF power observed at point 54 may result from arcing due to the lifting of one or several brushes 34 in one or both collector assemblies 18. In general, there may be a 2- to 10-fold increase 56 in RF signal power once the contact between one or more brushes 34 and the collector rings 36 begins to falter (e.g., between points 52 and 54).

As such, using the RFCTs 46 included in the circuit 30 (e.g., within the SVS 38) the RF signal power in the circuit 30 may be measured. In certain embodiments, the measurements of the RFCTs 46 may be transmitted to the processor 48 (e.g., a computer or controller) configured to further process the raw RFCT signals. For example, the processor 48 may apply a fast Fourier transform (FFT) operation to determine the RF signal power as a function of signal frequency. In certain embodiments, the processor 48 may also apply filters to the raw RFCT signals to remove RF noise prior to performing the FFT operation.

Figure 4:
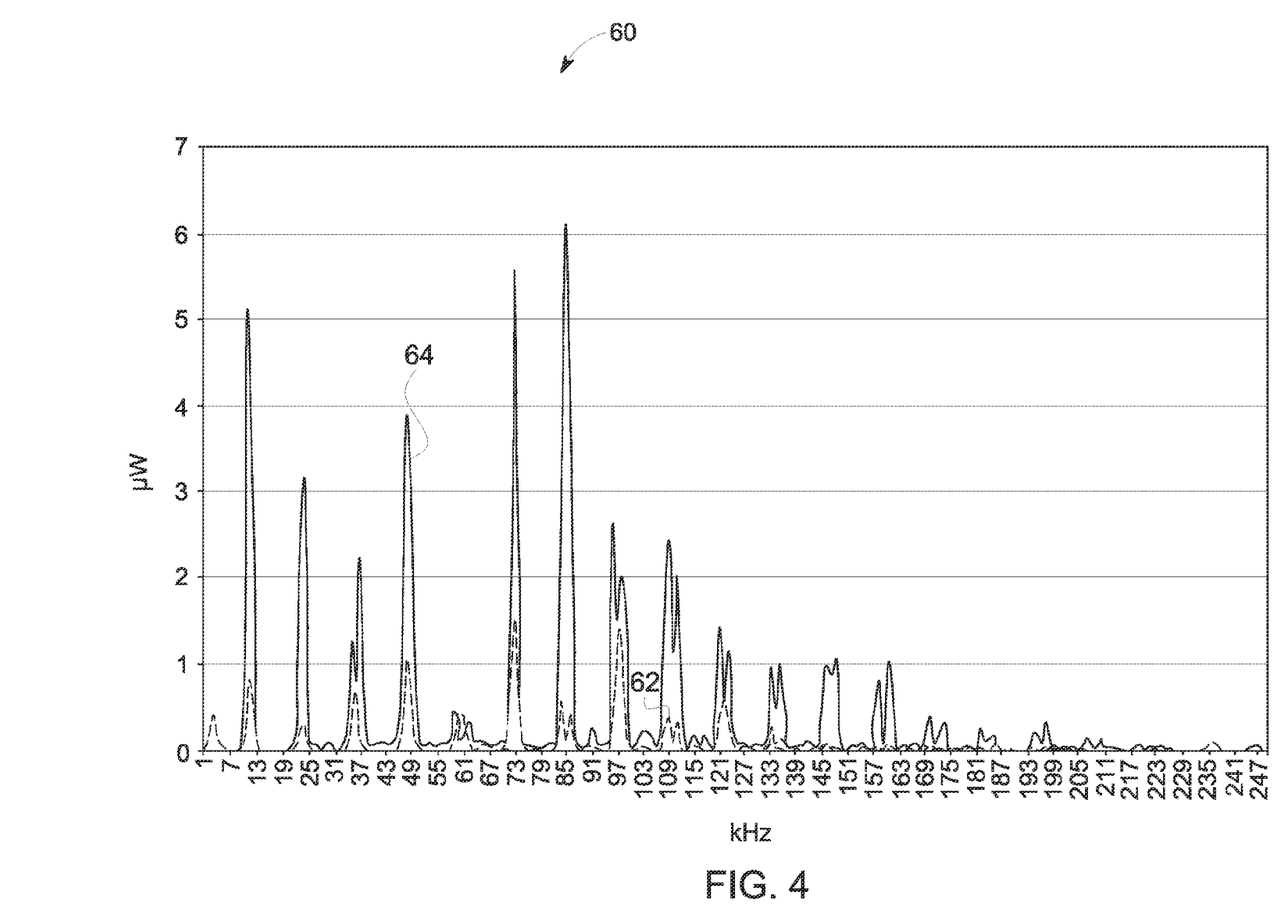
FIG. 4 is a graph illustrating plots of RF signal power versus signal frequency for an exciter circuit with and without substantial arcing occurring, in accordance with aspects of the present disclosure.

FIG. 4 illustrates a graph 60 of RF signal power (μW) versus signal frequency (kHz), such as may be attained after the processing of the raw signals of the RFCTs 46, as described above. The first curve 62 of plot 60 represents the RF signal power over the signal frequency range between 1 and 250 kHz when the brushes 34 are in good contact with the collector rings 36. Since this first curve 62 correlates to the point 52 of FIG. 3, only a baseline level of RF signal (e.g., RF noise) is observed, meaning that little to no arcing is detected. The second curve 64 of plot 60 represents the RF signal power over the same signal frequency range when the brushes 34 are not in good contact with the collector rings 36. Since this second curve 64 correlates to the point 54 of FIG. 3, an increased RF signal power is observed at a number of frequencies relative to the first curve 62, signifying a substantial increase in the amount of arcing occurring in the circuit 30.

Figure 5:
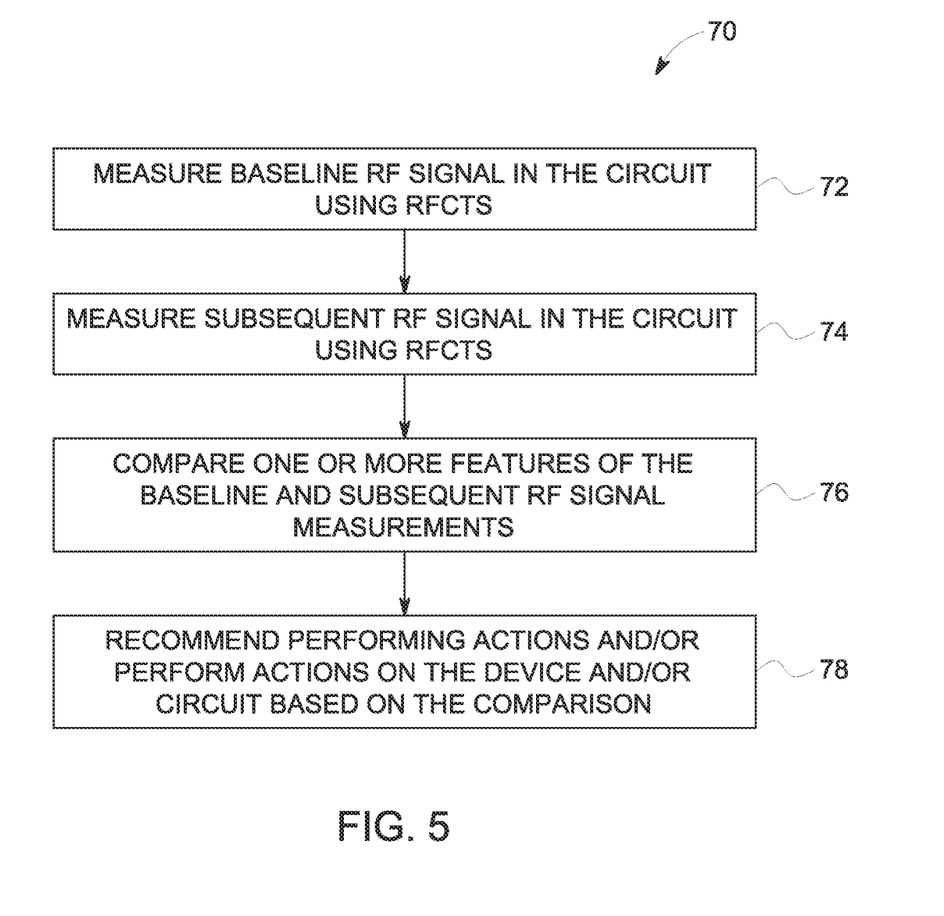
FIG. 5 is a flow diagram illustrating a process that a processor may use to measure RF signals in a circuit, access the health of the circuit, and recommend or perform actions based on the health of the circuit, in accordance with aspects of the present disclosure.

Accordingly, the processor 48 may perform an embodiment of the process 70 illustrated in FIG. 5 in measuring the RF signals, accessing the health of the circuit 30, and recommending and/or performing actions to the rotor 10. The process 70 begins with the processor 48 measuring (block 72) a baseline RF signal in the circuit using the RFCTs 46. For example, the processor 48 may measure the baseline RF signal when a rotor 10 is first installed or shortly after servicing the rotor 10, circuit 30, and/or the collector assemblies 18. In general, the baseline RF signal measured in block 72 should correlate to point 52 of FIG. 3 and curve 62 of FIG. 4 and, accordingly, represent little to no arcing in the circuit 30. After some amount of usage, the processor 48 may measure (block 74) a subsequent RF signal in the circuit 30 using the RFCTs 46. If the contact of the brushes 34 and the collector rings 36 is significantly poorer than when the baseline measurement was taken, the subsequent RF signal measured may correlate to the point 54 of FIG. 3 and curve 64 of FIG. 4 and, accordingly, represent a substantial degree of arcing within the circuit 30.

The processor 48 may subsequently compare (block 76) one or more features of the baseline and subsequent RF signal measurements to determine the health of the circuit 30 and/or the collector assembly 18. That is, turning once more to FIG. 4, the first curve 62 and the second curve 64 of the plot 60 may be compared in a number of different ways to assess the amount of arcing occurring within a circuit 30 and, therefore, assess the health of the circuit 30 and/or the collector assemblies 18. For example, the processor 48 may compare the maximum, median, or mean RF signal power values of the first and second curves (e.g., 62 and 64) over a particular frequency range. That is, the processor 48 may determine that the first curve 62 has a maximum RF signal power of approximately 1 μW between 45 and 55 kHz, and determine that the second curve 64 has a maximum RF signal power of approximately 4 μW in the same frequency range. In certain embodiments, the processor 48 may subtract a value from the second curve 64 from a value of the first curve 62 in order to subtract out the baseline noise. That is, the computer may subtract 1 μW from 4 μW to determine that the RF signal due to arcing is approximately 3 μW between 45 and 55 kHz. In other embodiments, the processor 48 may instead consider the ratio of a value from the second curve 64 to a value from the first curve 62. That is, the processor 48 may calculate the ratio of 4 μW to 1 μW to determine that the RF signal during arcing is roughly four times greater than the baseline between 45 and 55 kHz.

Additionally, in certain embodiments, the processor 48 may determine the integration of a portion of the first and second curves (e.g., 62 and 64) for comparison. Accordingly, the processor 48 may subsequently subtract the area under the second curve 64 over a certain frequency range (e.g., between 45 and 55 kHz) from the area under the first curve 62 over the same frequency range. In certain embodiments, the processor 48 may determine a ratio of the two integrals. Furthermore, in certain embodiments, the processor 48 may employ a combination approach and may compare multiple portions or features of the first curve 62 to the multiple portions or features of the second curve 64, as individually described above. For example, the processor 48 may determine the ratio of the maximum RF power of the first and second curves (e.g., 62 and 64) between 45 and 55 kHz as well as determine the ratio of the integrals of the first and second curves (e.g., 62 and 64) between 80 and 90 kHz to determine the level of arcing occurring within the circuit.

Turning once more to FIG. 5, the processor 48 may subsequently recommend or perform (block 78) a number of different actions to the rotor 10 and/or the circuit 30 after processing the raw data and/or plots, as described above. For example, the processor 48 may condense the RF signal power data, possibly in addition to historical RF signal power data, into a single collector health value (e.g., a quantitative or qualitative score). That is, based upon the degree of arcing detected in the RF signal power data, the processor 48 may determine a collector health value ranging from 100 (e.g., perfect health) to 0 (e.g., on the verge of flashover) for the circuit 30. For example, the processor 48 may determine that a particular circuit 30 has a collector health value greater than 95, meaning that little or no arcing is occurring and that the collector assemblies 18 and/or the circuit 30 are healthy. Accordingly, the processor 48 may output the collector health value, along with any other requested data, to an operator such that the operator may have an indication of the health of the collector without having to disrupt the operation of the equipment.

In the event that the processor 48 determines that a particular collector assembly 18 and/or circuit 30 is unhealthy (e.g., having a collector health value less than 20), in addition to outputting the value and/or related data to the operator, the processor 48 may sound an alarm, automatically schedule maintenance for the equipment, or recommend operational parameters for the generator, the circuit 30, and/or rotor 10. For example, if the collector health value is below 10, the processor 48 may signal an alarm to inform the operator that flashover may occur in the near future if the rotor 10 is not taken off-line and/or serviced. By further example, if the collector health value is below 80, the processor 48 may automatically generate a maintenance request (e.g., via an email, an electronic maintenance request system, etc.) based on the severity of the case. That is, if the collector health value for one generator is 80 and the collector health value for a second generator is 50, the second generator may be prioritized for maintenance over the first.

Additionally, the processor 48 may recommend the adjustment of operational parameters for the generator, the circuit 30 and/or rotor 10 based on the collector health value. That is, if the collector health value of a circuit 30 is 50 when the generator is at 100% power output, the processor 48 may recommend operating the generator at 50% power output. In certain embodiments, the processor 48 may determine the RF signal power after the parameters of the generator, the circuit 30, and/or the rotor 10 have been adjusted to determine if the collector health value has improved from the adjustment. In certain embodiments, the processor 48 may continually monitor the RF signal power of the circuit 30 in real-time and make automatic adjustments to the parameters of the generator, the circuit 30, and/or the rotor 10 in order to maintain the collector health value within a specified range. As such, the power output of a generator may be gradually dialed down from 100% as the collector health value of the rotor 10 begins to fall, preventing damage to the rotor 10 by avoiding the flashover event from occurring and allowing the generator to gracefully degrade performance until it is serviced. Additionally, in certain embodiments, the processor 48 may inform the operator that the health of the circuit 30 and/or the rotor 10 is sufficient to allow the generator to be pushed beyond normal operating conditions (e.g., 115% power output) for a limited period of time (e.g., to meet a short term power demand).

Additionally, by tracking the RF signal power within the circuit 30 over the life of the rotor 10, the health of the generator, the rotor 10, the collector assemblies 18, and/or the circuit 30 may be tracked over time. That is, based upon the trend of collector health values over time, the processor 48 may predict when the circuit 30 and/or rotor 10 will require servicing, and/or when the circuit 30 and/or rotor 10 is likely to fail (e.g., flashover), and inform the operator and/or schedule maintenance for the equipment. Additionally, the disclosed embodiments enable an operator to immediately determine if the maintenance that a collector assembly 18 and/or circuit 30 receives actually improves the health of the circuit 30, which may help to prevent damage to the circuit 30 due to operator error during the maintenance process (e.g., improper brush installation). Furthermore, the disclosed embodiments may be implemented in tandem with other equipment health monitoring and process control components as well as interface with industrial control systems such that the collector health values may be considered by the control system when managing the equipment.

Furthermore, it should be noted that existing electrical equipment (e.g., electrical generators and/or motors) may be modified to incorporate the features of the disclosed embodiments. For example, an SVS of an existing generator may be modified to include one or more RFCTs capable of sensing RF signals in the exciter circuit. In certain embodiments, the RFCTs may even be installed while the electrical equipment remains online, or while the electrical equipment has a portion of the power temporarily rerouted, allowing for minimal equipment downtime. With the aid of a processor, such a modification would enable the continual or intermittent assessment of the health of the circuit and/or generator and provide recommendations based on this health assessment.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. An electrical generator comprising:
an exciter circuit comprising:
a set of rotating field windings;
a direct current (DC) exciter that provides power to the exciter circuit;
a collector assembly that delivers power to the set of rotating field windings and comprises a plurality of brushes and collector rings; and
a shaft voltage suppressor (SVS) comprising a plurality of radio frequency current transformers (RFCTs) that measure radio frequency (RF) signals corresponding to energy associated with potential arcing events in collector assembly of the exciter circuit; and
a processor that receives the measurements from the plurality of RFCTs, processes the measurements to determine power of the RF signals as a function of signal frequency, and assesses the health of the collector assembly based, at least in part, on the determined power of the RF signals.

2. The electrical generator of claim 1, wherein the RF signals correspond to arcing events between the plurality of brushes and the collector rings of the collector assembly.

3. The electrical generator of claim 1, wherein the processor provides an alarm, requests maintenance of the electrical generator, predicts a future flashover event in the electrical generator, or any combination thereof, based, at least in part, on the assessment of the health of the collector assembly.

4. The electrical generator of claim 1, wherein assessing the health of the collector assembly comprises comparing one or more features of the function to one or more baseline values.

5. The electrical generator of claim 4, wherein the one or more features comprise a local maximum RF signal power, an average RF signal power over a frequency range, an integral of RF signal power over the frequency range, or any combination thereof.

6. A monitoring device for a collector assembly comprising stationary brushes and rotatable slip rings having an interface therebetween, wherein the monitoring device comprises:
   one or more radio frequency current transformers (RFCTs) positioned to measure radio frequency (RF) signals corresponding to energy associated with potential arcing events at the interface between the stationary brushes and the rotatable slip rings of the collector assembly; and
   a processor for receiving the measurements from the one or more RFCTs and determining a health value of the collector assembly based, at least in part, on the received measurements.

7. The monitoring device of claim 6, comprising a shaft voltage suppressor (SVS), wherein one or more of the RFCTs are located within the SVS.

8. The monitoring device of claim 6, wherein processor performs a fast Fourier transform (FFT) operation on the received measurements to determine RF signal power as a function of signal frequency.

9. The monitoring device of claim 6, wherein the processor determines the health value of the collector assembly by calculating a ratio of a baseline value to a peak of the function, a difference between a baseline value and a peak of the function, a mean value of the function over a signal frequency range, or an integral of the function over the signal frequency range.

10. The monitoring device of claim 9, wherein the processor determines operational parameters of the electrical system to alter based, at least in part, on the health value of the collector assembly.

11. The monitoring device of claim 10, wherein the processor alters the determined operational parameters of the electrical system based, at least in part, on the health value for the collector assembly.

12. The monitoring device of claim 9, wherein the processor provides an alarm, requests maintenance of the electrical system, predicts a future flashover event in the electrical system, or any combination thereof, based, at least in part, on the health value for the collector assembly.

13. The monitoring device of claim 6, comprising an exciter comprising a direct current (DC) power source that provides power to the monitoring device.

14. The monitoring device of claim 6 included in a generator or a motor.

* * * * *